(12) United States Patent
Tu et al.

(10) Patent No.: US 9,377,503 B2
(45) Date of Patent: Jun. 28, 2016

(54) SEMICONDUCTOR TEST STRUCTURES

(71) Applicants: An-Chun Tu, Taipei (TW); Chen-Ming Huang, Hsinchu (TW); Chih-Jen Wu, Chu-Dong Town (TW); Chin-Hsiang Lin, Hsin-Chu (TW)

(72) Inventors: An-Chun Tu, Taipei (TW); Chen-Ming Huang, Hsinchu (TW); Chih-Jen Wu, Chu-Dong Town (TW); Chin-Hsiang Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 68 days.

(21) Appl. No.: 14/246,405

(22) Filed: Apr. 7, 2014

(65) Prior Publication Data

US 2014/0206113 A1    Jul. 24, 2014

Related U.S. Application Data

(62) Division of application No. 13/241,634, filed on Sep. 23, 2011, now Pat. No. 8,704,224.

(51) Int. Cl.
*H01L 27/00*    (2006.01)
*G01R 31/26*    (2014.01)
*H01L 21/66*    (2006.01)
*G01R 31/28*    (2006.01)

(52) U.S. Cl.
CPC ........ *G01R 31/2644* (2013.01); *G01R 31/2884* (2013.01); *H01L 22/14* (2013.01); *H01L 22/32* (2013.01); *H01L 22/34* (2013.01); *H01L 2924/0002* (2013.01)

(58) Field of Classification Search
CPC ............... H01L 22/34; H01L 27/0207; H01L 27/11521; H01L 27/11558
See application file for complete search history.

(56) References Cited

U.S. PATENT DOCUMENTS

| | | | |
|---|---|---|---|
| 6,870,939 B2 | 3/2005 | Chiang et al. | |
| 7,860,258 B2 | 12/2010 | Azuma et al. | |
| 8,704,224 B2 | 4/2014 | Tu et al. | |
| 2004/0188678 A1 | 9/2004 | Wieczorek et al. | |
| 2009/0002012 A1* | 1/2009 | Doong | G01R 31/2853 324/762.03 |
| 2009/0050886 A1 | 2/2009 | Lee et al. | |
| 2009/0080257 A1* | 3/2009 | Oka | G11C 5/025 365/185.13 |

FOREIGN PATENT DOCUMENTS

| | | |
|---|---|---|
| CN | 102122637 | 7/2011 |
| TW | 2013351572 | 12/2013 |

* cited by examiner

*Primary Examiner* — Whitney T Moore
*Assistant Examiner* — Joseph Galvin, III
(74) *Attorney, Agent, or Firm* — Haynes and Boone, LLP

(57) ABSTRACT

A method performed using a resistive device, where the resistive device includes a substrate with an active region separated from a gate electrode by a dielectric and electrical contacts along a longest dimension of the gate electrode, the method comprising, performing one or more processes to form the resistive device, measuring a resistance between the electrical contacts, and correlating the measured resistance with a variation in one or more of the processes.

20 Claims, 5 Drawing Sheets

SEMICONDUCTOR TEST STRUCTURES

PRIORITY INFORMATION

The present application is a divisional application of U.S. patent application Ser. No. 13/241,634, filed Sep. 23, 2011, which is hereby incorporated by reference in its entirety.

BACKGROUND

Process variation may lead to lower yields in semiconductor manufacture. One conventional approach for detecting process variation includes the use of test patterns. One conventional test pattern includes a resistor formed on a substrate. Active regions are formed in the substrate material by doping, and one or more of the active regions can be used as a resistor. To form the resistor, metal contacts are placed along the length dimension of an active region. Resistance is then measured between the contacts.

It is generally assumed that process variation, which may result in feature dimensional variation, doping variation, and the like, may affect the resistance of the test pattern. Thus, process variation may be detected by discerning a difference in measured resistance versus another resistance value. It is also generally assumed that process variation affecting a test pattern may affect one or more other portions (or the entirety) of the wafer.

However, some conventional test patterns are not sensitive enough to provide reliable indications of some process variation. What is needed is a test pattern capable of providing more robust results.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

SUMMARY

Figure 1:
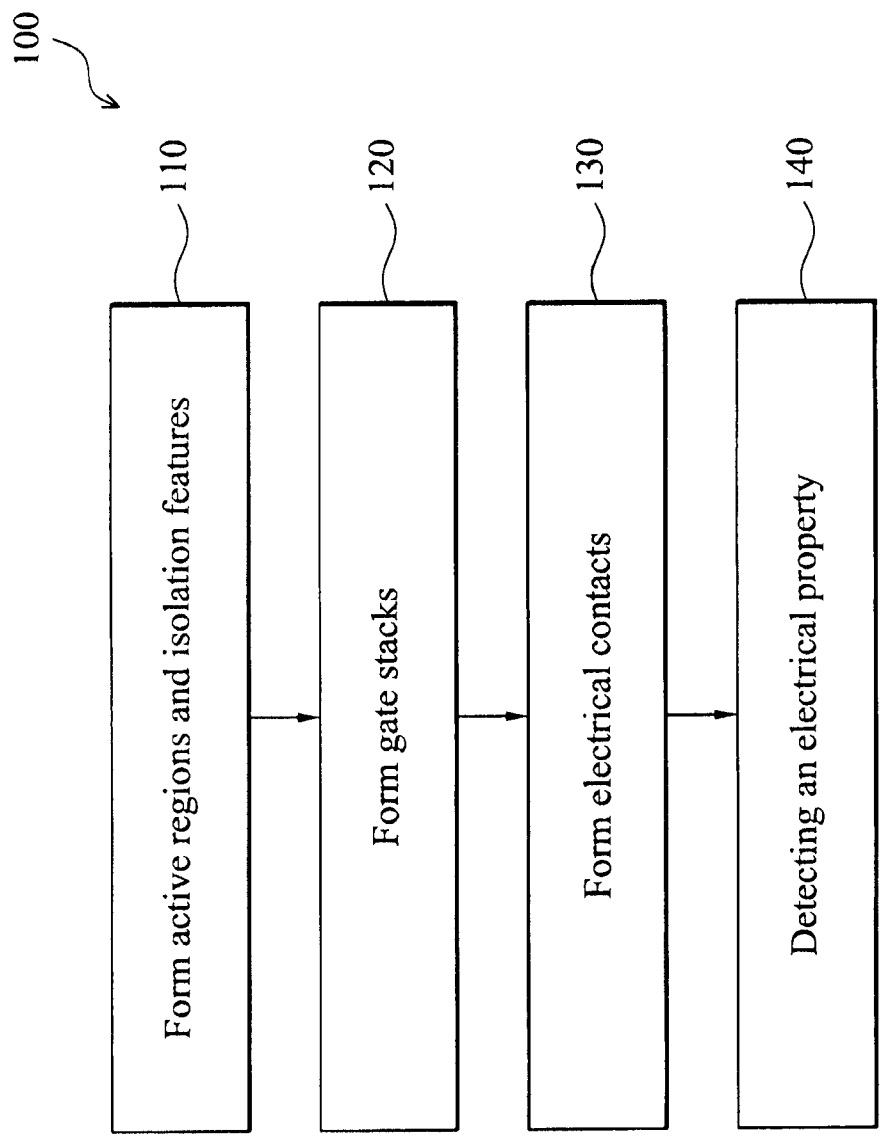
FIG. 1 is a flowchart of an example method for making and testing a resistive semiconductor test structure constructed according to various aspects of the present disclosure.

One of the broader forms of the present disclosure involves a resistive test structure including a semiconductor substrate with an active region, a gate stack formed over the active region, a first electrical contact in communication with the active region on opposing sides of the gate stack, the first electrical contact providing an electrical short across a first dimension of the gate stack, and a second electrical contact in communication with the active region on the opposing sides of the gate stack, the second electrical contact providing an electrical short across the first dimension of the gate stack, the first and second electrical contacts spaced along a second dimension of the gate stack perpendicular to the first dimension.

Another one of the broader forms of an embodiment of the present disclosure involves a method performed using a resistive device, where the resistive device includes a substrate with an active region separated from a gate electrode by a dielectric and electrical contacts along a longest dimension of the gate electrode, the method including performing one or more processes to form the resistive device, measuring a resistance between the electrical contacts, and correlating the measured resistance with a variation in one or more of the processes.

Another one of the broader forms of an embodiment of the present disclosure involves a semiconductor device including a Metal Oxide Semiconductor (MOS) structure having a semiconductor substrate with an active region and a gate stack disposed on the active region, a first pair of electrical contacts on opposing side of the gate stack in communication with the active region, the first pair of electrical contacts being electrically connected across a first dimension of the gate stack, and a second pair of electrical contacts on the opposing side of the gate stack in communication with the active region, the second pair of electrical contacts being electrically connected across the first dimension of the gate stack, the first and second pairs of electrical contacts spaced along a longest dimension of the gate stack perpendicular to the first dimension.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Various embodiments are directed to resistive test patterns and methods of making and using the resistive test patterns. In one example, a resistive test pattern is formed using Metal Oxide Semiconductor (MOS) processes to form a gate structure over a substrate. In this example, the substrate includes active regions, where one or more of the active regions can be used to form actual working components (e.g., transistors), and other active regions can be used to form test patterns.

In the case of a test pattern, a dielectric material is formed over an active region on the substrate, and a gate electrode is formed over the dielectric material. The gate electrode and the active region, separated by the dielectric material, form a capacitive structure that is typical of MOS transistors. The test pattern includes two or more electrical contacts distributed over a longest dimension of the gate electrode. One example electrical contact is a metal contact that straddles the gate electrode to make contact with the active region on either side of the gate structure, thereby forming an electrical short across the gate electrode (e.g., source to drain). Further in this example, the electrical contact may not directly touch the gate electrode. A second electrical contact may be configured similarly to the first electrical contact and be spaced apart from the first electrical contact along the longest dimension of the gate electrode.

The gate electrode and dielectric material may be formed similarly to transistors on the same wafer. In examples wherein the transistors have metal gate stacks and use high-k (HK) dielectric materials, the test patterns may also include metal gate stacks and HK materials formed during the same processes. Similarly, in embodiments wherein the gate electrode is a polysilicon gate electrode and the dielectric material is a non-HK dielectric material (e.g., SiO2), the test pattern may also include the same materials formed by the same processes.

Test patterns according to various embodiments may be formed in any of several locations. In one example, the test patterns are formed on a dummy wafer that is not intended for use in a product. In another example, a test pattern is formed on a production wafer in a scribe line, with actual circuits, or elsewhere. Furthermore, various embodiments include two or more test patterns formed in proximity to each other.

Other embodiments include methods for testing for process variation using the resistive test patterns. After the test patterns are formed, the resistance between electrical contacts is measured between the electrical contacts. If the resistance is markedly different from another resistance value, the difference may be an indication of process variation. In one embodiment that includes two similar test patterns in proximity to each other, the resistance of each test pattern may be measured and a difference calculated. The difference ($\Delta R$) may be an indication of process variation.

The method proceeds with correlating the measurement with a process variation. For instance, the differences discussed above may be correlated with a variation in critical dimension or other dimension, doping, annealing, thermal characteristics, and/or the like. If the variation falls outside of an acceptable range, the wafer or batch may be failed. If the variation falls within an acceptable range, the wafer or batch may be passed. In either event, further testing may be applied before finally failing or passing materials.

The above illustrations are provided as brief examples. Various embodiments are described in more detail below.

Figure 2:
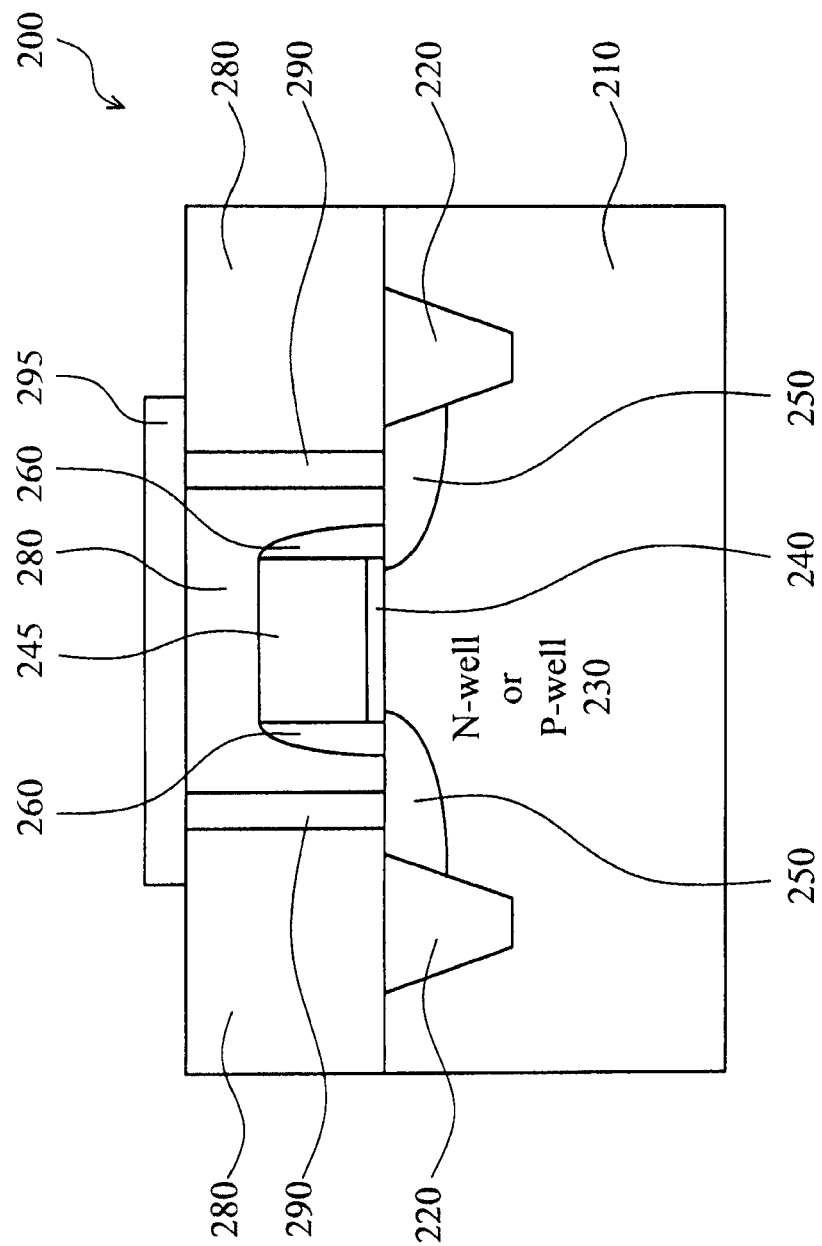
FIG. 2 is a cross-sectional view of an example embodiment of a semiconductor test structure constructed according to various aspects of the present disclosure.
Figure 3:
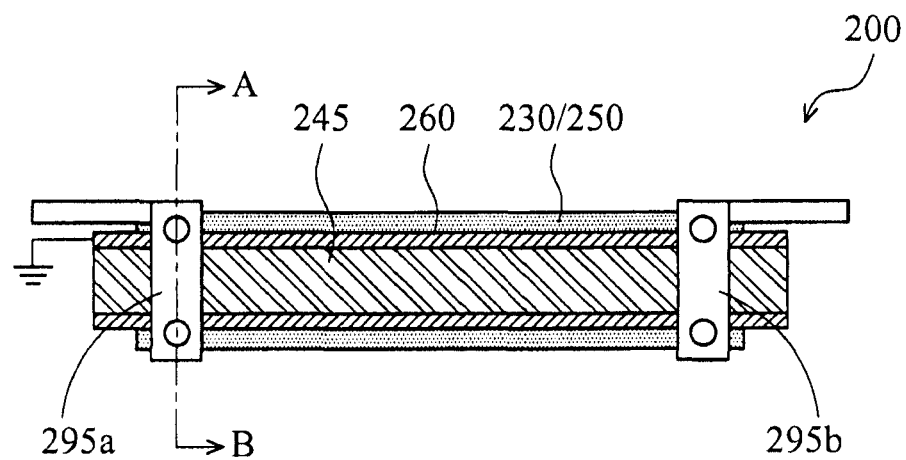
FIG. 3-7 are top view illustrations of various semiconductor test structures constructed according to various aspects of the present disclosure.

FIG. 1 is a flowchart of one example embodiment of a method 100 for making and testing a wafer having test patterns according to various aspects of the present disclosure. FIG. 1 is described with reference to FIGS. 2 and 3. FIG. 2 is a cross-sectional view of a single test pattern 200, and FIG. 3 is a limited top view of test pattern 200 (omitting STIs). Line A-B in FIG. 3 shows a cut corresponding to the cross-section of FIG. 2. While FIGS. 2 and 3 focus on one test pattern, it is understood that many of the processes described below are performed on a wafer level to form not only test patterns, but transistors as well.

In block 110, active regions and STIs are formed on a substrate 210. The substrate may include silicon, germanium, silicon germanium, or other appropriate semiconductor materials. Also, in some examples, the semiconductor substrate 210 may include an epitaxial layer. For example, the substrate 210 may have an epitaxial layer (not shown) overlying a bulk semiconductor. Further, the substrate 210 may be strained for performance enhancement. For example, the epitaxial layer may include a semiconductor material different from those of the bulk semiconductor such as a layer of silicon germanium overlying a bulk silicon or a layer of silicon overlying a bulk silicon germanium formed by a process including selective epitaxial growth (SEG). Furthermore, the substrate 210 may include a semiconductor-on-insulator (SOI) structure (not shown) such as a buried dielectric layer. Also alternatively, the substrate may include a buried dielectric layer (not shown) such as a buried oxide (BOX) layer, such as that formed by a method referred to as separation by implantation of oxygen (SIMOX) technology, wafer bonding, SEG, or other appropriate method. In fact various embodiments may include any of a variety of appropriate substrate structures and materials.

In FIG. 2, the substrate 210 also includes various isolation features and the isolation features may include different structures and can be formed using different processing technologies. For example, an isolation feature may include shallow trench isolation (STI) feature 220. The formation of STI 220 may include etching a trench (not shown) in substrate 210 and filling the trench by insulator materials such as silicon oxide, silicon nitride, or silicon oxynitride. The filled trench may have a multi-layer structure such as a thermal oxide liner layer with silicon nitride filling the trench. As an example, the STI 200 may be created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical planarization (CMP) to etch back excessive oxide.

In FIG. 2, various active regions are defined on the substrate after the formation of the STI features. Various doped features, such as a P-well or N-well 230, are formed in the active regions by implantation techniques. Any appropriate implantation techniques now known or later developed may be used.

Returning to FIG. 1, block 120 includes forming gate stacks. The various embodiments are not limited to any particular method of forming gate stacks. Example methods for forming gate stacks include forming a conductive layer over a dielectric layer and patterning the conductive layer to form the gate stacks. The dielectric layer may include silicon oxide, a high-k (HK) dielectric, or combination of both. The conductive layer may include polysilicon or metal. With respect to metal gate stacks with HK layers, some embodiments include a gate-first or gate-last process or an HK-first or an HK-last process (where an HK layer is formed before or after, respectively, source/drain regions are formed). Formation of metal gate stacks may also include use of a dummy polysilicon gate structure that is removed and replaced by work function metals. The various embodiments are not limited to any particular method of forming gate stacks, and any suitable method may be used in some embodiments. Thus, HK-first, HK-last, gate-first and gate last, and dummy gate processes are not described in detail other than to describe the various materials that may be used and the processes that may be employed to form the materials.

In an embodiment that employs a polysilicon gate electrode, a dielectric layer 240, such as SiO2, is disposed over the substrate 210 by ozone oxidation, CVD, ALD or any appropriate method. Thereafter, polysilicon 245 is disposed over the dielectric layer 240 by CVD technique. Then the dielectric layer 240 and polysilicon 245 are patterned to form a gate stack, using, e.g., photoresist or further with a hard mask.

Furthermore, doped source/drain (S/D) regions, 250 are formed in active region 230 by various ion implantation processes and are aligned with the gate stack. N-type dopant impurities employed to form the associated doped regions may include phosphorus, arsenic, and/or other species. P-type dopant impurities may include boron, indium, and/or other materials. In some embodiments source and drain region 250 may include lightly doped drain (LDD), heavily doped source and drain portions and may also include salicide for reduced contact resistance. Also in some embodiments, N-type source and drain regions may use a silicon germanium (SiGe) epitaxial growth layer (not shown) with lightly doped phosphorous, heavily doped phosphorous, or other suitable species. Alternatively, some embodiments may include a uniform doping profile, such as by omitting LDD features and heavily-doped features. Active region 230 may be formed by a single implantation or multiple implantations.

Gate spacers 260 may be formed by dielectric deposition and dry etching process. In some embodiments, gate spacers 260 are formed after the LDD but before heavily doped portions are formed.

After formation of the S/D regions 250, one or more annealing processes may be performed to activate the S/D regions. The annealing processes comprise rapid thermal annealing (RTA), laser annealing processes, or other suitable annealing processes. As an example, a high-temperature thermal annealing step may apply temperatures anywhere in the range of 900 C-1100 C, though other embodiments may use temperatures within a different range. As another example, high-temperature annealing includes thermal processes with temperatures above 600 C. Further, this embodiment may include a "spike" annealing process that has a very short time duration. An inter-layer dielectric (ILD) 280 is then formed on the semiconductor substrate and the dummy gate stacks by a suitable process, such as deposition and polishing.

As mentioned above, some embodiments may included a HK dielectric instead of dielectric layer 240 and may include a work function metal instead of polysilicon 245, though the basic shape is the same as that shown in FIG. 1, including the use of active region 230, sidewalls 260, and S/D 250. In such an example, block 120 may include depositing and annealing an HK dielectric material and may additionally include a thin silicon oxide interfacial layer underlying the HK dielectric material layer. The HK dielectric material may include $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable HK dielectric materials, or combinations thereof. The HK material may be deposited by chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), other suitable methods, or combinations thereof. The interfacial layer can be silicon oxide and may be formed by various suitable methods such as thermal oxidation, ALD or UV-Ozone Oxidation. A post HK layer deposition annealing may be performed to enhance moisture control in gate dielectrics.

Continuing with the HK and metal gate example, block 120 may also include depositing a barrier layer over the HK layer. Barrier layers (also referred to as "cap layers") conduct electricity and prevent inter-diffusion and reaction between metals, silicon or dielectric materials. The candidates for a barrier material may include refractory metals and their nitrides (e.g. TiN, TaN, W2N, TisiN, TaSiN). A metal barrier layer may be deposited by physical vapor deposition (PVD), chemical vapor deposition (CVD), Metal-organic chemical vapor deposition (MOCVD) and atomic layer deposition (ALD).

Further continuing with the example, block 120 may include forming N-type metal gate stacks and P-type metal gate stacks as gate electrodes, respectively, in N-type and P-type devices. Forming an N-type metal gate stack may include forming a tantalum nitride (TaN) layer and forming one of a TiAl layer and a TiAlN layer on the TaN layer. The forming of a P-type metal gate stack may include forming a tantalum nitride (TaN) layer, forming a tungsten nitride (WN) layer on the TaN layer, and forming one of a TiAl layer and a TiAlN layer on the WN layer. In one embodiment, the N-type metal gate includes a tantalum nitride layer. The N-type metal layers may additionally include a titanium aluminum (TiAl) layer or a titanium aluminum nitride (TiAlN) layer. In one embodiment, the metal layers are deposited by using a chemical vapor deposition (CVD) process or other suitable process. By the disclosed method, the metal gate stacks for NFET and PFET are formed with different compositions and configurations.

Block 130 includes forming electrical contacts, which in FIG. 2 have plugs 290 and shorting member 295. The ILD 280 may be etched to form contact holes, and metal plugs 290 are formed in the contact holes. Shorting member 295 may be a metal line formed by depositing and patterning a conductor or by a damascene process. Metal plugs 290 and shorting member 295 may be formed of copper, tungsten, or other suitable conductive material by an appropriate method, such as sputtering, CVD, plating, or a combination thereof. The method may include further processes, such as a Chemical Mechanical Polishing (CMP) process, performed before the shorting member 295 is formed but after the plugs 290 are formed, to polish the substrate and substantially remove the excessive metal and other materials above the substrate surface. A CMP process may be additionally performed during the damascene process to form the shorting member 295.

The electrical contacts may be formed as part of a multilayer interconnection. The multilayer interconnection may include vertical interconnects, such as conventional vias or contacts, and horizontal interconnects, such as metal lines. The various interconnection features may implement various conductive materials including copper, tungsten and silicide. In one example, a damascene process is used to form copper related multilayer interconnection structure, including the contacts. In another embodiment, tungsten is used to form tungsten plugs in the contact holes to form the contacts.

Block 140 includes detecting an electrical property of the test pattern and, if applicable, correlating the electrical property with a process variation. In one example, block 140 includes detecting the resistance of one or more test patterns, such as test pattern 200. The detected electrical property can often be a reliable indicator of process variation affecting the test patterns as well as affecting one or more devices, such as transistors. Variations in dimensional properties of structures, in doping, in thermal processing, a combination of any of the above, and/or the like may affect the electrical properties (such as resistance) of the test pattern.

In contrast to a transistor, in which electrical current flows from the source to the drain, in test pattern 200 the electrical current flows along the longest dimension of the test pattern (i.e., between shorting members 295a and 295b). Thus, in testing the resistance of the test pattern 200, the test equipment causes current to flow along the longest dimension, which is in contrast to the operation of a conventional transistor that may have a similar cross-sectional profile.

In one example testing procedure, the resistance of the test pattern 200 is detected and compared to an expected value. In another embodiment, the resistance of test pattern 200 is detected and compared to a detected resistance of another test pattern. A comparison of the detected resistance of test pattern 200 may be an indicator of process variation, where a greater difference (ΔR) between resistance of test pattern 200 and another resistance value indicates a greater degree of process variation. Correlating a test result to a process variation may be performed manually by a human, who is presented the values of the detected electrical properties, or by a computer.

Therefore, it is possible in some embodiments to assign some ranges of ΔR as acceptable and some ranges as unacceptable. Testing in block 140 may include passing or failing a wafer or batch (or perhaps even a single die region in a wafer) in response to the testing.

The scope of embodiments is not limited to the exact actions described above with respect to FIG. 1. Rather, some embodiments may add, omit, rearrange, or modify one or more actions as appropriate. For instance, some embodiments may further include additional testing procedures to identify process variation or other phenomena. In some embodiments, the resistance testing of test patterns is not dispositive as to whether a semiconductor device passes or fails, but rather may lead to further testing.

Returning to FIG. 3, it is noted that test pattern 200 has one end connected to ground. Voltage biasing, such as shown in FIG. 3, may be helpful in testing the electrical properties of test pattern 200 by ensuring an adequate amount of current when the other end of the test pattern is held at a voltage potential different from ground. In other embodiments, voltage biasing may include coupling an end of test pattern 200 to a voltage potential different than ground, where the other end may be subjected to a different potential (ground or otherwise) during testing. In some embodiments, the gate electrode of test pattern 200 may be floating. Either or both ends may be grounded, biased, or floating, and in some instances the state of either end may be controlled individually.

Figure 4:
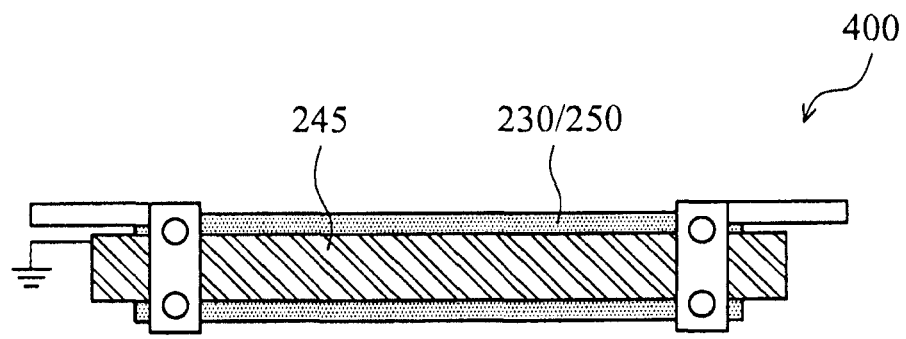

In FIG. 3, test pattern 200 is shown as including sidewalls 260, though other embodiments may omit sidewalls for a simpler configuration. FIG. 4 is an illustration of an exemplary embodiment test strip 400. Test strip 400 is similar to test strip 200 but omits sidewalls 260.

Figure 5:
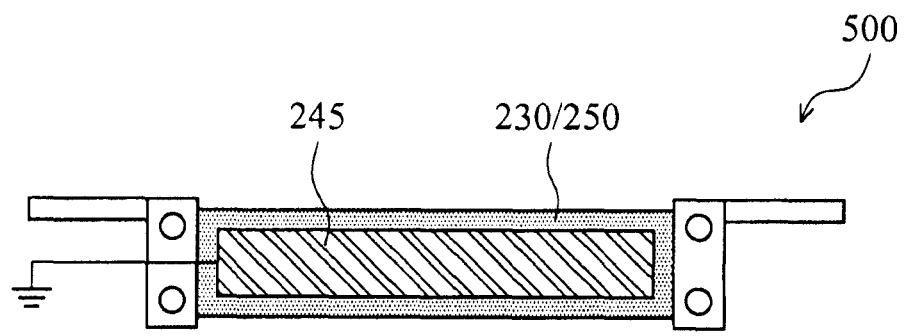

In other embodiments, a test pattern may have a gate electrode that does not extend the entire length of the active region or does not extend from one electrical contact to the other. FIG. 5 is an illustration of an exemplary embodiment of test pattern 500, where the gate electrode material 245 is configured as such.

Figure 6:
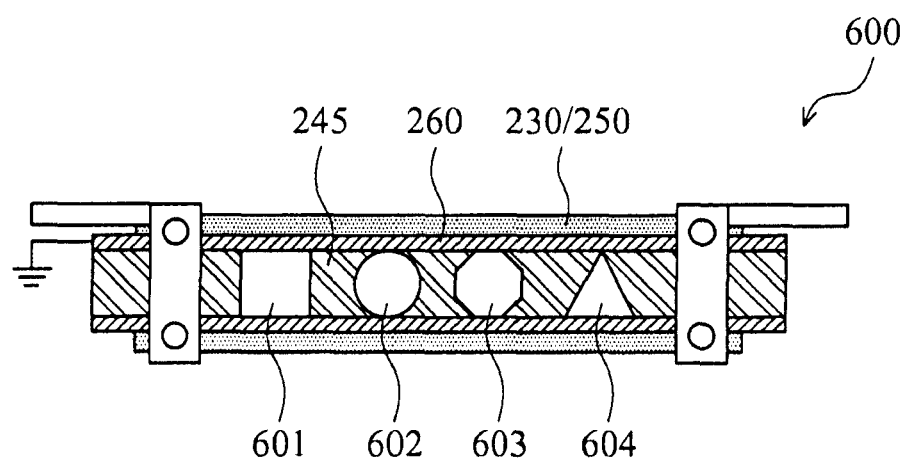

Additionally, the various materials of a test pattern may be shaped in any arbitrary manner. FIG. 6 is an illustration of an exemplary test pattern 600 adapted according to one embodiment. FIG. 6 shows the gate electrode material 245 with a variety of shapes 601-604 patterned therein. Other embodiments may include different ways of shaping the test pattern, such as by making it at a right angle (or other angle) instead of making it entirely linear. Still further, other embodiments may shape the sidewalls, active regions, or other structures in any arbitrary way that may assist in detecting process variation.

Figure 7:
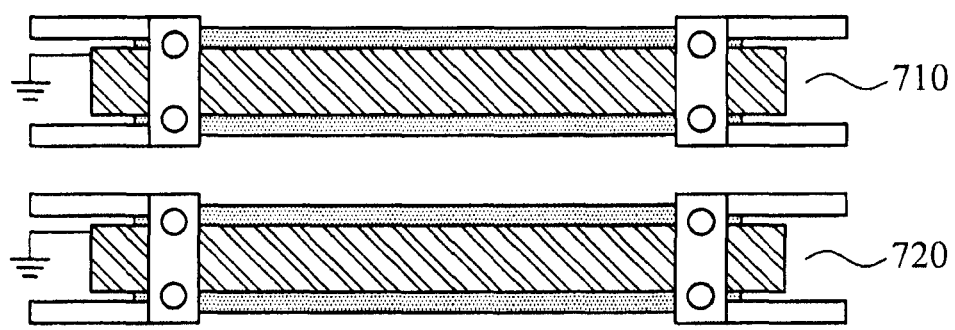

As mentioned above, some embodiments may include forming two or more test patterns in proximity to each other. FIG. 7 is an illustration of exemplary test patterns 710 and 720 adapted according to one embodiment. In this example, test patterns 710 and 720 have the same structure and are formed on the same wafer using the same processes. For instance, the processes may include doping, photoresist coating, photo exposure/developing, and photoresist removal. In theory, the test patterns 710 and 720 should be identical and should manifest their sameness by having the same electrical properties. Testing may include calculating a value for ΔR between test patterns 710 and 720 as well as their bias and U %. A non-zero value for ΔR or differing values for bias or U % may indicate process variation. Depending on the results of the test, further action may or may not be taken.

Various embodiments may include one or more advantages over conventional approaches. As explained above, conventional approaches employ test patterns that include a substrate portion but fail to include other features that are affected by process variation. By contrast, one embodiment of the present disclosure conforms to a MOS configuration, including a gate electrode and a dielectric layer separating the gate electrode from an active region of the substrate. The resistive test pattern of such embodiment includes many (if not all) of the same features as active devices (e.g., transistors) on the substrate. Additionally, the test pattern is formed by the same processes that form the dielectric layers and gate electrodes of the active devices of the wafer. Thus, the test pattern according to this embodiment is a more faithful replication of the active devices, and it is accordingly more sensitive to variations in wafer-level processes that affect the gate electrodes and the dielectric layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a resistive test structure, the method comprising:
   providing a semiconductor substrate with an active region;
   forming a gate stack over the active region;
   forming a first electrical contact in communication with the active region on opposing sides of the gate stack, the first electrical contact providing an electrical short across a first dimension of the gate stack without being positioned directly above the gate stack; and
   forming a second electrical contact in communication with the active region on the opposing sides of the gate stack, the second electrical contact providing an electrical short across the first dimension of the gate stack, the first and second electrical contacts spaced along a second dimension of the gate stack perpendicular to the first dimension.

2. The method of claim 1, wherein the gate stack includes a gate electrode that does not extend along an entirety of the active region in the second dimension.

3. The method of claim 1, wherein the gate stack is configured in at least one of the following arrangements:
   grounded at one or both of the first and second electrical contacts;
   voltage biased at one or both of the first and second electrical contacts; or
   one or both of the first and second electrical contacts are floating.

4. The method of claim 1, wherein the gate stack omits sidewalls.

5. The method of claim 1, wherein the gate stack includes a gate electrode, further wherein the gate electrode includes one or more shapes formed therein.

6. The method of claim 1, wherein the active region includes a uniform doping profile.

7. The method of claim 1, wherein the active region includes a heavily doped region and a light-doped region.

8. The method of claim 1, wherein each of the first and second electrical contacts includes a pair of metal plugs on each of the opposing sides with a shorting member coupling the pair of metal plugs.

9. The method of claim 1, wherein the test structure is formed in one of the following locations:
   a dummy wafer;
   a scribe line of a production wafer; or
   a circuit region of a production wafer.

10. A method of forming a semiconductor device, the method comprising:
   forming a Metal Oxide Semiconductor (MOS) structure having:
      a semiconductor substrate with an active region and a gate stack disposed on the active region;
   forming a first pair of electrical contacts on opposing side of the gate stack in communication with the active region, the first pair of electrical contacts being electrically connected across a first dimension of the gate stack; and
   forming a second pair of electrical contacts on the opposing side of the gate stack in communication with the active region, the second pair of electrical contacts being electrically connected across the first dimension of the gate stack, the first and second pairs of electrical contacts spaced along a longest dimension of the gate stack perpendicular to the first dimension, the first and second pairs of electrical contacts positioned beyond the gate stack in the longest dimension.

11. The method of claim 10, wherein the gate stack includes a gate electrode that comprises at least one of the following materials:
   polysilicon; or
   a gate metal.

12. The method of claim 10, wherein the gate stack includes a gate dielectric that comprises at least one of:
   a high-k dielectric layer with an oxide interfacial layer; or
   SiO2.

13. The method of claim 10, wherein the semiconductor device is formed in one of the following locations:
   a dummy wafer;
   a scribe line of a production wafer; or
   a circuit region of a production wafer.

14. A method for forming a resistive test structure, the method comprising:
   providing a semiconductor substrate with an active region;
   forming a transistor over the active region, the transistor having a gate stack, source, and a drain;
   providing a first electrical short between the source and the drain, across a first dimension of the gate stack; and
   providing a second electrical short between the source and the drain, across the first dimension of the gate stack,
   wherein the first and second electrical shorts are spaced along a second dimension of the gate stack perpendicular to the first dimension and extend beyond the gate stack in the second dimension.

15. The method of claim 14, further comprising:
   providing a gate electrode connecting to the gate stack, the gate electrode not extending along an entirety of the active region in the second dimension.

16. The method of claim 14, wherein the gate stack is configured in at least one of the following arrangements:
   grounded at one or both of the first and second electrical contacts;
   voltage biased at one or both of the first and second electrical contacts; and
   one or both of the first and second electrical contacts are floating.

17. The method of claim 14, wherein the gate stack does not include sidewalls.

18. The method of claim 14, wherein the gate stack includes a gate electrode, further wherein the gate electrode includes one or more shapes formed therein.

19. The method of claim 14, wherein the active region includes a uniform doping profile.

20. The method of claim 14, wherein each of the first and second electrical shorts includes a pair of metal plugs contacting the source and drain, and a conducting portion coupling the pair of metal plugs.

* * * * *